United States Patent
Confalonieri et al.

(10) Patent No.: US 9,553,546 B2
(45) Date of Patent: Jan. 24, 2017

(54) DIFFERENTIAL OUTPUT STAGE OF AN AMPLIFICATION DEVICE, FOR DRIVING A LOAD

(71) Applicant: ST-Ericsson SA, Plan-les-Ouates (CH)

(72) Inventors: Pierangelo Confalonieri, Monza e Brianza (IT); Federico Guanziroli, Monza e Brianza (IT); Germano Nicollini, Piacenza (IT)

(73) Assignee: OPTIS CIRCUIT TECHNOLOGY, LLC, Plano, TX (US)

( * ) Notice: Subject to any disclaimer, the term of this patent is extended or adjusted under 35 U.S.C. 154(b) by 0 days.

(21) Appl. No.: 14/654,861

(22) PCT Filed: Jan. 21, 2014

(86) PCT No.: PCT/EP2014/051111
§ 371 (c)(1),
(2) Date: Jun. 23, 2015

(87) PCT Pub. No.: WO2014/114632
PCT Pub. Date: Jul. 31, 2014

(65) Prior Publication Data
US 2015/0349716 A1 Dec. 3, 2015

Related U.S. Application Data

(60) Provisional application No. 61/760,421, filed on Feb. 4, 2013.

(30) Foreign Application Priority Data

Jan. 22, 2013 (EP) ..................................... 13152211

(51) Int. Cl.
*H03F 3/217* (2006.01)
*H03F 1/02* (2006.01)
(Continued)

(52) U.S. Cl.
CPC ............ *H03F 1/0205* (2013.01); *H03F 1/307* (2013.01); *H03F 1/3205* (2013.01); *H03F 3/183* (2013.01);
(Continued)

(58) Field of Classification Search
CPC ...... H03F 1/0205; H03F 3/183; H03F 3/2171; H03F 3/211; H03F 3/45179; H03F 2200/03; H03F 2203/21142; H03F 2200/351; H03F 1/307; H03F 1/3205; H03F 3/2173; H03F 3/2178; H03F 3/3059; H03F 3/3064
(Continued)

(56) References Cited

U.S. PATENT DOCUMENTS 5,162,752 A * 11/1992 Padi ..................... H03F 1/0261
330/263
5,194,824 A 3/1993 Wu et al.
(Continued)

OTHER PUBLICATIONS

International Search Report issued in corresponding International application No. PCT/EP2014/05111, date of mailing of the report Mar. 21, 2014.
(Continued)

*Primary Examiner* — Khanh V Nguyen
(74) *Attorney, Agent, or Firm* — The Danamraj Law Group, P.C.; Thomas L. Crisman; Kenneth A. McClure

(57) ABSTRACT

A differential output stage of an amplification device, for driving a load, comprises a first and a second differential output stage portion. The first differential output stage portion comprises: a first and a second output circuit; a first driving circuit comprising a first biasing circuit; a second driving circuit comprising a second biasing circuit. The first differential output stage portion comprises: a third output circuit connected between a first node of said first biasing circuit and a first differential output terminal, having a third
(Continued)

driving terminal connected to a first driving terminal; a fourth output circuit connected between a first node of the second biasing circuit and the first differential output terminal, having a fourth driving terminal connected to a second driving terminal.

19 Claims, 4 Drawing Sheets

(51) Int. Cl.
| | |
|---|---|
| *H03F 3/183* | (2006.01) |
| *H03F 3/21* | (2006.01) |
| *H03F 3/45* | (2006.01) |
| *H03F 1/30* | (2006.01) |
| *H03F 1/32* | (2006.01) |
| *H03F 3/30* | (2006.01) |

(52) U.S. Cl.
CPC ............ *H03F 3/211* (2013.01); *H03F 3/2171* (2013.01); *H03F 3/2173* (2013.01); *H03F 3/2178* (2013.01); *H03F 3/3059* (2013.01); *H03F 3/3064* (2013.01); *H03F 3/45179* (2013.01); *H03F 3/217* (2013.01); *H03F 2200/03* (2013.01); *H03F 2200/351* (2013.01); *H03F 2203/21142* (2013.01)

(58) Field of Classification Search
USPC .................... 330/207 A, 251, 253, 255, 261
See application file for complete search history.

(56) References Cited

U.S. PATENT DOCUMENTS

| | | | | |
|---|---|---|---|---|
| 6,028,479 | A * | 2/2000 | Babanezhad | ......... H03F 3/3061 330/255 |
| 8,040,165 | B2 * | 10/2011 | Azetsuji | ........... H03K 19/00361 327/112 |
| 2009/0153242 | A1 | 6/2009 | Cygan et al. | |
| 2010/0164457 | A1 | 7/2010 | Al-Shyoukh | |
| 2011/0148893 | A1 * | 6/2011 | An | ....................... G09G 3/3614 345/545 |

OTHER PUBLICATIONS

European Search Report issued in corresponding European application No. EP 13 15 2211, date of completion of the search Jun. 24, 2013.

Erickson, Robert W., et al., "Origins of Harmonic Distortion in Switching Amplifiers," article from book "Advances in Switched-Mode Power Conversion," vol. III, pp. 57-61, Jan. 1, 1983, XP002254185.

* cited by examiner

DIFFERENTIAL OUTPUT STAGE OF AN AMPLIFICATION DEVICE, FOR DRIVING A LOAD

TECHNICAL FIELD

The present invention relates to electronic devices for differentially driving a load, particularly the invention relates to a differential output stage of an amplification device, for driving a load.

BACKGROUND ART

Electronic devices for differentially driving a load are known.

In the mobile phones segment, the load is represented by the loudspeaker of a mobile phone and the electronic device for differentially driving such a load is typically a Class D amplifier.

In the FIG. 1, a differential output stage 100 of a Class-D amplifier, for differentially driving a load, belonging to the prior art, is shown.

With reference to FIG. 1, input signals INPH-INPL and INNH-INNL, are the outputs of a Pulse Width Modulator (PWM), not shown in the figure, arranged upstream the differential output stage 100 and being included in the Class-D amplifier. The differential output stage 100 is arranged to differentially drive a load schematically represented by a resistor $R_{LOAD}$ and an inductor $L_{LOAD}$ connected in series with one another.

In mobile phone applications or in general in the audio field, the supply voltage VDD of the differential output stage 100 is maintained at a high power level in order to guarantee the needed power to the load.

Typically, the differential output stage 100 comprises an output circuit comprising two switches connected in series with one another, i.e. a PMOS transistor M1PSW and a NMOS transistor M1NSW, respectively, between the first reference potential VDD and the second reference potential GND.

With recent technologies, in which MOS transistors are less able to sustain high power level voltages, a PMOS transistor M1PCASC and a NMOS transistor M1NCASC connected in series in a cascode configuration with the MOS transistor M1PSW and NMOS transistor M1NSW, respectively, have been introduced in the output circuit of the differential output stage 100, in order to reduce VGD (voltage drop between a gate terminal and a drain terminal), VGS (voltage drop between a gate terminal and a source terminal) and VDS (voltage drop between a drain terminal and a source terminal) of any MOS transistor of the output circuit of the differential output stage 100.

In their off state (OFF), the PMOS transistor M1PSW and the NMOS transistor M1NSW are driven on a respective gate terminal with driving voltages DRIVEPSW and DRIVENSW, respectively, having value close to the supply voltage VDD or the ground GND. In their on state (ON), the PMOS transistor M1PSW and the NMOS transistor M1NSW are driven on the respective gate terminal with driving voltages DRIVEPSW and DRIVENSW, respectively, having always the same distance, independently from the supply voltage VDD, from the supply voltage VDD or the ground GND. In a corresponding way, the PMOS transistor M1PCASC and the NMOS transistor M1NCASC have the same distance, independently from the supply voltage VDD, from the supply voltage VDD or the ground GND, so that driving voltages, in the on state of the MOS transistors, always maintain the same distance to the supply voltage VDD (for the PMOS transistors) or to the ground GND (for the NMOS transistors) even if the supply voltage VDD changes.

This is in order to obtain driving voltages which guarantee reliability and maintain a constant VGS voltage in the MOS transistor in the on state. This also implies the reduction of the resistance variation of the MOS transistors present in the output circuit of the differential output stage 100 for improving linearity of the signal on the load also in the case of variation of the supply voltage VDD.

In order to generate the driving voltage DRIVEPSW and DRIVENSW, the differential output stage 100 comprises a driving circuit 110 arranged to provide a current of the $V_{ref}/R$ type that in the differential output stage 100, being $V_{ref}$ a fixed voltage (e.g. 1.6V), flows in resistances correspondent to R1 and R4, respectively, obtaining constant and precise value of driving voltages.

With reference again to FIG. 1, the driving circuit 110 comprising a PMOS transistor M1P and a NMOS transistor M1N having a impedance which is negligible for the current I1 flowing in the PMOS transistor M1P and the current I4 flowing in the NMOS transistor M1N, i.e. the voltage drop on the PMOS transistor M1P and the NMOS transistor M1N of the driving circuit 110 is negligible with respect to the currents I1 and I4. In addition, the level of the input signal INLL and the level of the input signal INLH are compatible with reliability, and are logically coincident.

In view of this, in the case the input signals INPL and INPH are high, the output signal OP of the differential output device 100 is high (close to the supply voltage VDD) and, in the case the input signals INPL and INPH are low, the output signal OP of the differential output stage 100 is low (close to the ground GND).

However, the differential output stage 100 of FIG. 1 has many drawbacks.

In fact, the resistive load $R_{LOAD}$ is usually heavy (e.g. 8 Ohms) and therefore the MOS transistors (M1PSW, M1PCASC, M1NCASC and M1NSW) of the output circuit of the differential output stage 100 are very large (e.g. having a width W=10000-30000 µm) and almost represents the total area of the differential output stage 100 and therefore of the Class-D amplifier.

In addition, despite the dimension, the voltage drop between the drain terminal and the source terminal (VDS) of each MOS transistor of the output circuit of the differential output stage 100 represents a limit for the linearity of the output signal OL on the load. This is due to the fact that the impedance of each MOS transistor of the output circuit of the differential output stage 100 is not constant but changes according to the changes of the drop voltage VDS of each MOS transistor. The drop voltage VDS can change on the basis of the value of the current IL present on the resistive/inductive load.

In this regard, it should be considered the equation of a MOS transistor in the linear zone, as follows:

$$I=k\cdot[(VGS-VT)\cdot VDS-(VDS^2)/2]$$

wherein I is the current flowing in the MOS transistor, K is a constant depending on technology and dimension of the MOS transistor, VGS is the voltage drop between the gate terminal and the source terminal of the MOS transistor, VT is the threshold voltage of the MOS transistor, and VDS is the voltage drop between the drain terminal and the source terminal of the MOS transistor.

The resistance R of the MOS transistor is 1/G, wherein G is the conductance of the MOS transistor, equal to the following equation:

$$G = dI/dVDS = k \cdot [(VGS-VT)-VDS] = k \cdot (VGS-VDS-VT)$$
$$= k \cdot [(VG-VS)-(VD-VS)-VT] = k \cdot (VGD-VT)$$

This means that the resistance R of the MOS transistor is constant only in the case the voltage drop VGD (voltage drop between the gate terminal and the drain terminal of the MOS transistor) is fixed, thus in the case the gate voltage VG is fixed while the drain voltage VD changes with the current IL present on the resistive/inductive load, the resistance R of the MOS transistor is not constant.

This condition limits linearity performances of the signal on the resistive/inductive load, mainly in open-loop Class D amplifier applications. It could be possible to improve linearity performances by increasing the dimensions of the MOS transistor of the output circuit of the differential output stage 100, in order to reduce the effect of the variation of the resistance of the MOS transistors (as explained above), but this approach is incompatible with the need to save acceptable area and costs of the differential output stage 100, and then of the Class-D amplifier.

SUMMARY OF THE INVENTION

An object of the present invention is to provide a differential output stage on an amplification device, for driving a load, which overcomes at least some of the drawbacks and limitations of the known prior art and particularly which allows to obtain a great increasing of the linearity of the output signal on the load, without substantially increasing the acceptable area of the device.

A differential output stage of an amplification device, for driving a load, according to the invention, comprises: a first differential output stage portion having a first differential input terminal and a first differential output terminal, said first differential input terminal comprising a first input terminal and a second input terminal; a second differential output stage portion having a second differential input terminal and second differential output terminal, said second differential input terminal comprising a third input terminal and a fourth input terminal, the load being electrically connected between said first and second differential output terminal. The first differential output stage portion further comprises: a first output circuit connected between a first reference potential and said first differential output terminal; a second output circuit connected between a second reference potential and said first differential output terminal; a first driving circuit of the first output circuit arranged to connect said first input terminal to a first driving terminal of said first output circuit, said first driving circuit comprising a first biasing circuit arranged to provide to the first driving terminal a first driving signal; a second driving circuit of the second output circuit arranged to connect said second input terminal to a second driving terminal of said second output circuit, said second driving circuit comprising a second biasing circuit arranged to provide to the second driving terminal a second driving signal.

The first differential output stage portion further comprises: a third output circuit connected between a first node of said first biasing circuit and the first differential output terminal, said third output circuit having a third driving terminal connected to said first driving terminal; a fourth output circuit connected between a first node of said second biasing circuit and the first differential output terminal, said fourth output circuit having a fourth driving terminal connected to said second driving terminal.

BRIEF DESCRIPTION OF THE DRAWINGS

The characteristics and the advantages of the present differential output stage of an amplification device for driving a load will be better understood from the following detailed description of one embodiment thereof, which is given by way of illustrative and non-limiting example with reference to the annexed drawings, in which.

DETAILED DESCRIPTION OF PREFERRED EMBODIMENTS

Figure 2:
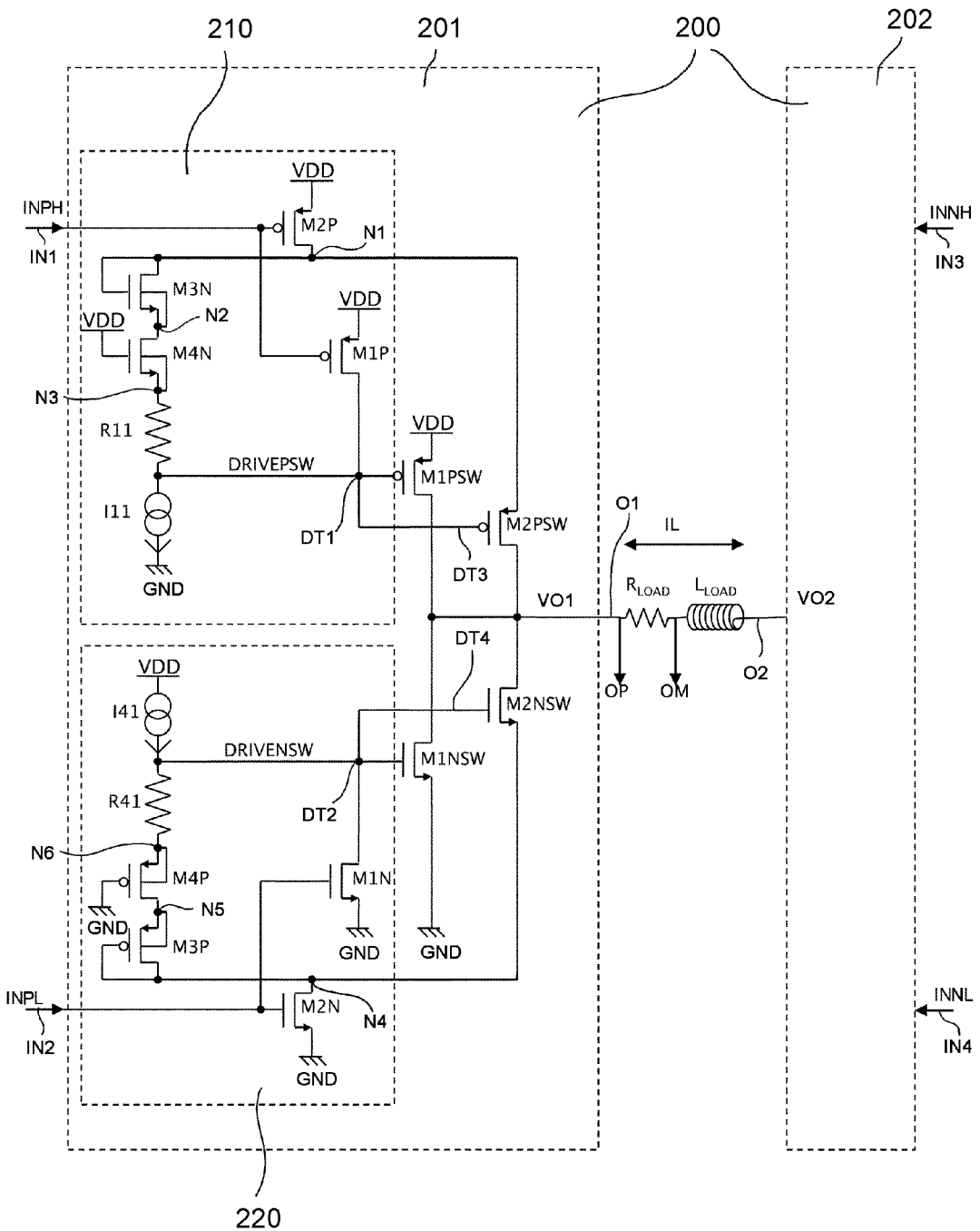
FIG. 2 shows a circuit diagram of a differential output stage according to a first embodiment of the invention.
Figure 3:
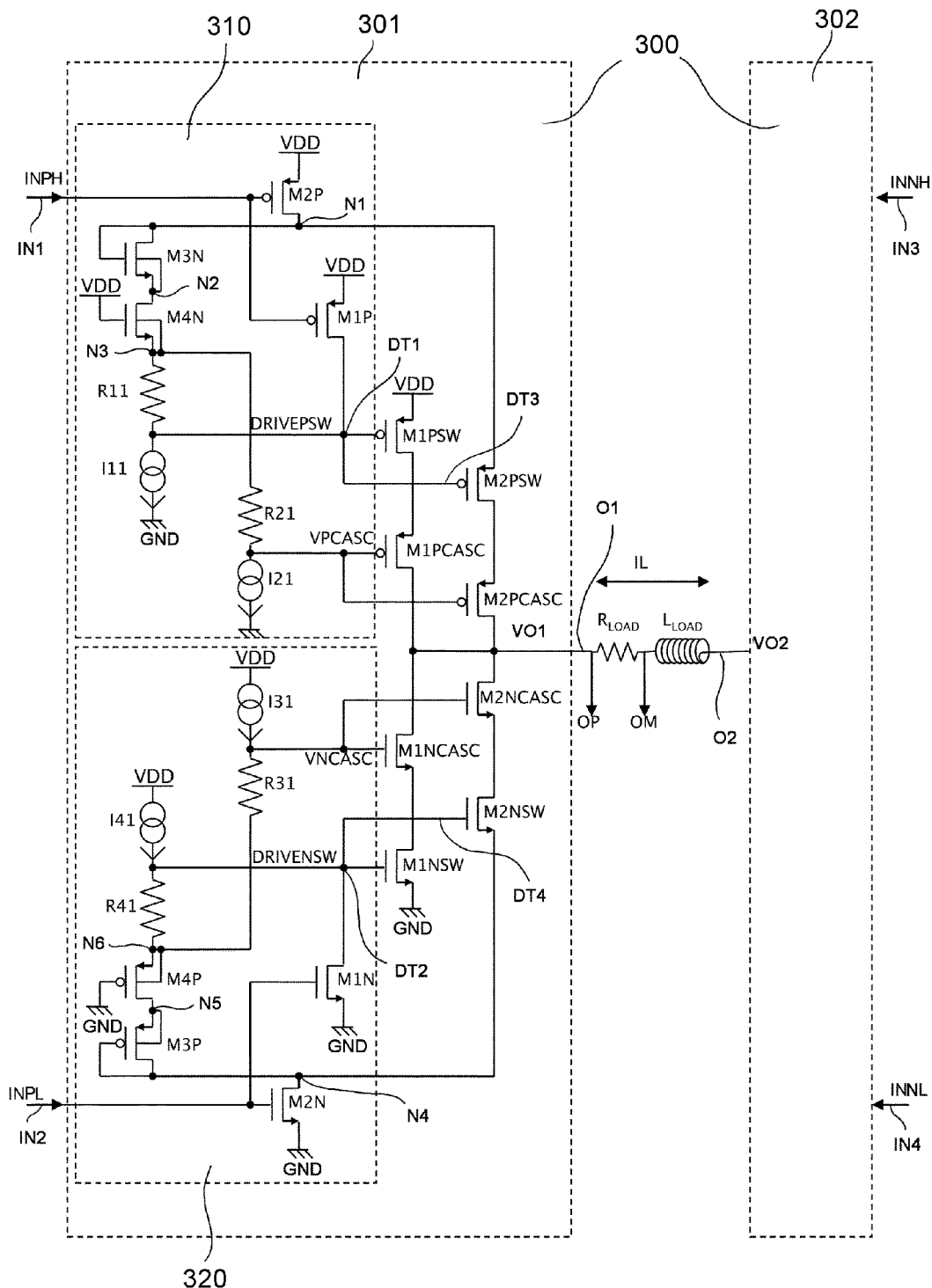
FIG. 3 shows a circuit diagram of a differential output stage according to a second embodiment of the invention.

With reference to the circuit diagrams of FIGS. 2 and 3, a differential output stage of an amplification device for driving a load RLOAD, LLOAD can be described, according to the embodiments of the present invention.

The load to be driven is typically a resistive-inductive load, such as a loudspeaker of an audio system, which can be schematically represented by a resistor RLOAD and an inductor LLOAD in series with one another.

Figure 4:
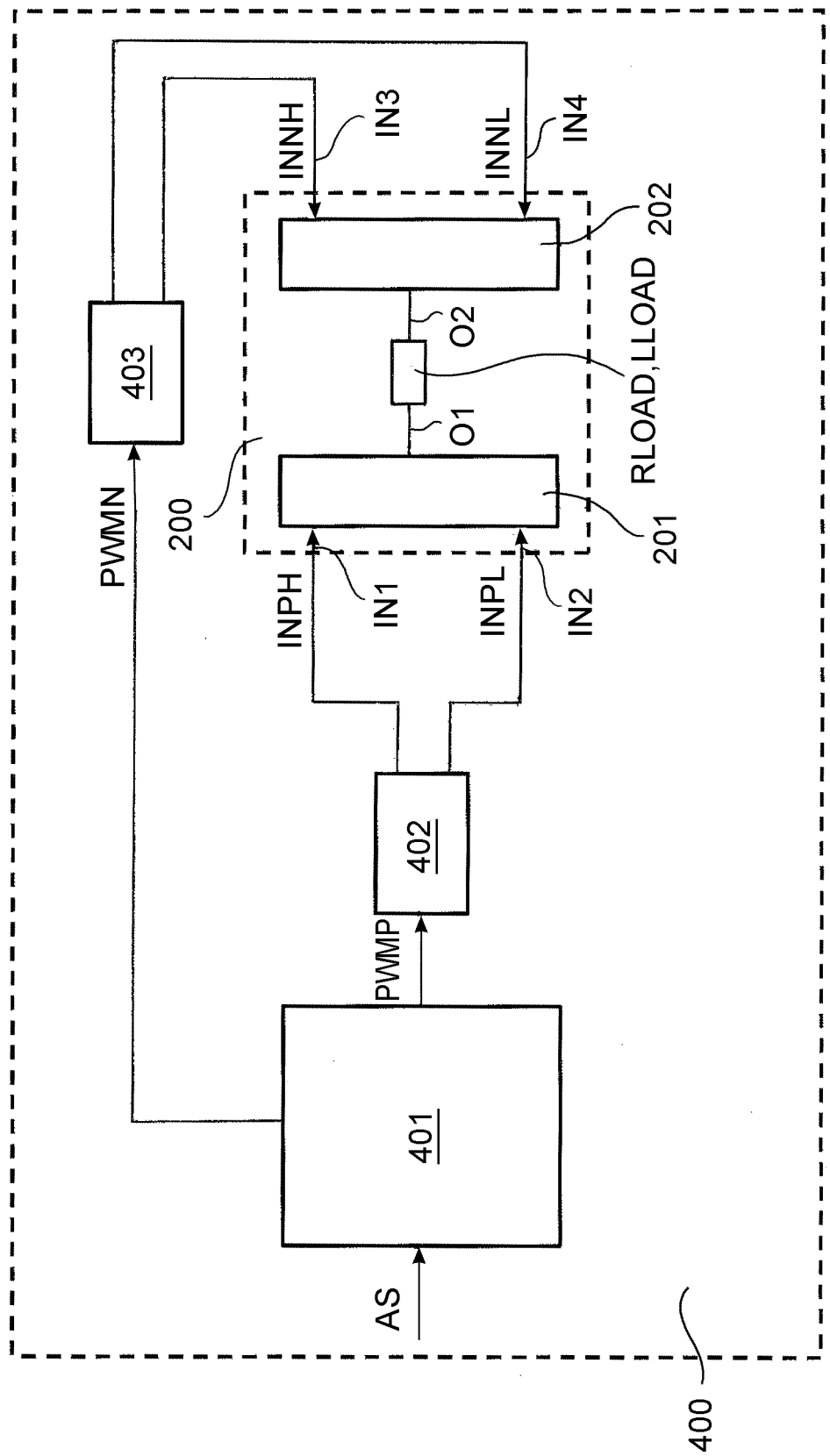
FIG. 4 shows a block diagram of an amplification device including a differential output stage according to the invention.

The amplification device, schematically represented in FIG. 4 and indicated with the reference number 400, can be for example a Class D amplifier or any other amplification device comprising, upstream the differential output stage (indicated with the reference number 200), a Pulse Width Modulator (PWM), indicated with the reference number 401.

Such an amplification device can be employed in any electronic equipment (portable or not) using an amplification device with a digital output stage and a PWM modulator. For example, the amplification device including the differential output stage according to the embodiments of the invention can be used in audio systems (e.g. mobile phones, MP3 players, PDAs, portable computers), in automotive systems and so on.

With reference to FIG. 2, a differential output stage 200 according to a first embodiment of the present invention is now described, from a circuital point of view. The operation of the differential output stage 200 will be described after the description of the circuital structure of both the differential output stage 200 of the embodiment of FIG. 2 and the differential output stage 300 of the embodiment of FIG. 3.

The differential output stage 200 comprises a first differential output stage portion 201 having a first differential input terminal IN1, IN2 and a first differential output terminal O1.

In a greater detail, the first differential input terminal IN1, IN2 comprises a first input terminal IN1 and a second input terminal IN2.

The differential output stage 200 further comprises a second differential output stage portion 202 having a second differential input terminal IN3, IN4 and a second differential output terminal O2.

In a greater detail, the second differential input terminal IN3, IN4 comprises a third input terminal IN3 and a fourth input terminal IN4.

As shown in the FIG. 2, the load RLOAD, LLOAD is electrically connected between said first differential output terminal O1 and the second differential output terminal O2.

It should be noted that the differential output stage 200 is a output stage or buffer to be employed in a mono audio system.

The first differential output stage portion 201 can be considered as the positive (P) side of the differential output stage 200 and the second differential output stage portion 202 can be considered as the negative (N) side of the differential output stage 200.

In fact, as previously mentioned and with reference now also to FIG. 4, the amplification device 400 comprising the differential output stage 200 further comprises a PWM modulator 401.

The PWM modulator 401 is arranged to receive an input signal AS generated by the audio system and to generate a first differential digital output signal PWMP at high logical level to be provided to the first differential input terminal IN1, IN2 of the first differential output portion 201 of the differential output stage 200 and a second differential digital output signal PWMN to be provided to the second differential input terminal IN3, IN4 of the second differential output portion 202 of the differential output stage 200.

According to a first example, the PWM modulator 401 can be of the analog type and therefore the input signal AS can be of the analog type, e.g. a differential input (two wires) or single-ended input (one wire).

According to a second example, the PWM modulator 401 can be of the digital type and the input signal AS can be of the digital type.

In a greater detail, the amplification device 400 further comprises a first non-overlapping and voltage shifting block 402 arranged to receive the first differential output digital signal PWMP and to generate a first differential digital input signal INPH to be provided to the first input terminal IN1 and a second differential digital input signal INPL to be provided to the second input terminal IN2, respectively, of the first differential output stage portion 201 of the differential output stage 200.

It should be noted that the first input terminal IN1 and the second input terminal IN2 are physically separated but logically coincident, i.e. they are at the same time both at a high logical level or both at a low logical level.

In a corresponding way, the amplification device 400 further comprises a second non-overlapping and voltage shifting block 403 arranged to receive the second differential output digital signal PWMN and to generate a third differential digital input signal INNH to be provided to the third input terminal IN3 and a fourth differential digital input signal INNL to be provided to the fourth input terminal IN4, respectively, of the second differential output stage portion 202 of the differential output stage 200.

It should be noted that also the third input terminal IN3 and the fourth input terminal IN4 are physically separated but logically coincident, i.e. they are at the same time both at a high logical level or both at a low logical level.

It should be noted that both the first non-overlapping and voltage shifting block 402 and the second non-overlapping and voltage shifting block 403 may (or may not) be arranged within the first differential output stage portion 201 and the second differential output stage portion 202 of the differential output stage 200. In the circuit diagram of FIG. 4, for the sake of clarity, the first non-overlapping and voltage shifting block 402 and the second non-overlapping and voltage shifting block 403 are represented outside the differential output stage 200.

Turning back in general to the differential output stage 200, it should be observed that in the case of an application in a stereo audio system, the differential output stage 200, to be considered for example the left side of a stereo audio system, are replicated to obtain also the right side of the stereo audio system.

In a corresponding way, with reference to the amplification device 400 of FIG. 4, also the PWM modulator 401 and the first 402 and second 403 non-overlapping and voltage shifting block, to be considered for example the left side of a stereo audio system, are replicated in order to obtain the right side of the stereo audio system.

Turning back to the embodiment of FIG. 2, the first differential output stage portion 201 of the differential output stage 200 further comprising a first output circuit M1PSW connected between a first reference potential VDD and the first differential output terminal O1.

The first reference voltage VDD is for example the power supply of the electronic equipment in which the amplification device with the differential output stage 200 is included. An example of values of the first reference voltage is 2.4-5 V.

The first differential output stage portion 201 further comprises a second output circuit M1NSW connected between a second reference potential GND and the first differential output terminal O1.

The second reference potential GND is for example the ground (e.g. 0V).

The first differential output stage portion 201 further comprises a first driving circuit 210 of the first output circuit M1PSW arranged to connect the first input terminal IN1 to a first driving terminal DT1 of the first output circuit M1PSW. The first driving circuit 210 comprises a first biasing circuit M2P, M3N, M4N, R11, I11 arranged to provide to the first driving terminal DT1 a first driving signal DRIVEPSW.

The first differential output stage portion 201 further comprises a second driving circuit 220 of the second output circuit M1NSW arranged to connect the second input terminal IN2 to a second driving terminal DT2 of the second output circuit M1NSW. the second driving circuit 220 comprises a second biasing circuit I41, R41, M4P, M3P, M2N arranged to provide to the second driving terminal DT2 a second driving signal DRIVENSW.

The first differential output stage portion 201 advantageously further comprises a third output circuit M2PSW connected between a first node N1 of the first biasing circuit M2P, M3N, M4N, R11, I11 and the first differential output terminal O1. The third output circuit M2PSW has a third driving terminal DT3 connected to the first driving terminal DT1.

In addition, the first differential output stage portion 201 advantageously further comprises a fourth output circuit M2NSW connected between a first node N4 of the second biasing circuit I41, R41, M4P, M3P, M2N and the first differential output terminal O1. The fourth output circuit M2NSW has a fourth driving terminal DT4 connected to the second driving terminal DT2.

In a greater detail, the first biasing circuit M2P, M3N, M4N, R11, I11 comprises a first PMOS transistor M2P, a first NMOS transistor M3N, a second NMOS transistor M4N, a first resistor R11 and a first current generator I11 connected in series between the first reference potential VDD and the second reference potential GND.

The first PMOS transistor M2P has a first terminal connected to first reference potential VDD, a second terminal connected to a first terminal of the first NMOS transistor M3N, a gate terminal connected to the first input terminal IN1.

The first NMOS transistor M3N has a second terminal connected to a first terminal of the second NMOS transistor M4N and to a body terminal of the first NMOS transistor M3N, a gate terminal connected to the first terminal of the first NMOS transistor M3N.

The second NMOS transistor M4N has a second terminal and a body terminal connected to each other and to a first terminal of the first resistor R11 and a gate terminal connected to the first reference potential VDD.

In addition, the first resistor R11 has a second terminal operatively connected to the second reference potential GND via the first current generator I11. The second terminal of the first resistor R11 is further connected to first driving terminal DT1.

However, as an important aspect of the invention, it should be noted that also the first NMOS transistor M3N and the second NMOS transistor M4N have substantially the same threshold voltage ($VT_{M3N}=VT_{M4N}$).

Turning in general to the first driving circuit 210 of FIG. 2, it further comprises a second PMOS transistor M1P having a first terminal connected to the first reference potential VDD and a second terminal connected to the first driving terminal DT1. The second PMOS transistor M1P has a gate terminal connected to the first input terminal IN1.

Referring now to the second biasing circuit I41, R41, M4P, M3P, M2N of FIG. 2, it comprises a second current generator I41, a second resistor R41, a third PMOS transistor M4P, a fourth PMOS transistor M3P and a third NMOS transistor M2N connected in series between the first reference potential VDD and the second reference potential GND.

In a greater detail, the third NMOS transistor M2N has a first terminal connected to second reference potential GND, a second terminal connected to a the first terminal of the fourth PMOS transistor M3P, a gate terminal connected to the second input terminal IN2.

The fourth PMOS transistor M3P has a second terminal connected to a first terminal of the third PMOS transistor M4P and to a body terminal of the fourth PMOS transistor M3P, a gate terminal connected to the first terminal of the fourth PMOS transistor M3P.

The third PMOS transistor M4P comprises a second terminal and a body terminal connected to each other and to a first terminal of the second resistor R41 and a gate terminal connected to the second reference potential GND.

In addition, the second resistor R41 has a second terminal operatively connected to the first reference potential VDD via the second current generator I41. The second terminal of the second resistor R41 is connected to second driving terminal DT2.

It should be noted that the third PMOS transistor M4P and the fourth PMOS transistor M3P have substantially the same threshold voltage ($VT_{M4P}=VT_{M3P}$).

Turning in general to the second driving circuit 220 of FIG. 2, it further comprises a fourth NMOS transistor M1N having a first terminal connected to the second reference potential GND and a second terminal connected to the second driving terminal DT2. The fourth NMOS transistor M1N has a gate terminal connected to the second input terminal IN2.

With reference again to the differential output stage 200 of FIG. 2, the first output circuit M1PSW comprises a fifth PMOS transistor M1PSW having a first terminal connected to the first reference potential VDD, a second terminal connected to the first differential output terminal O1 and a gate terminal connected to the first driving terminal DT1.

In addition, the third output circuit M2PSW comprises a sixth PMOS transistor M2PSW having a first terminal connected to a first node N1 of the first biasing circuit M2P, M3N, M4N, R11, I11, a second terminal connected to the first differential output terminal O1, a gate terminal connected to the third driving terminal DT3.

Furthermore, the second output circuit M1NSW comprises a fifth NMOS transistor M1NSW having a first terminal connected to the second reference potential GND, a second terminal connected to the first differential output terminal O1 and a gate terminal connected to the second driving terminal DT2.

In addition, the fourth output circuit M2NSW comprises a sixth NMOS transistor M2NSW having a first terminal connected to a first node N4 of the second biasing circuit I41, R41, M4P, M3P, M2N, a second terminal connected to the first differential output terminal O1, a gate terminal connected to the fourth driving terminal DT4.

With reference again to the circuit diagram of FIG. 2, it should be observed that the second differential output stage portion 202 of the differential output stage 200 is analogous to the first differential output stage portion 201 previously described.

For this reason, a detailed description of the second differential output stage portion 202 can be omitted for sake of brevity.

With reference now to the circuit diagram of FIG. 3, a differential output stage 300 of an amplification device for driving a load RRLOAD, LLOAD according to a second embodiment of the invention, is now described from a circuital point of view. The operation of the differential output stage 300 will be briefly described after the description of the circuital structure of both the differential output stage 200 of the embodiment of FIG. 2 and the differential output stage 300 of the embodiment of FIG. 3.

The differential output stage 300 comprises a first differential output stage portion 301 having a first differential input terminal IN1, IN2 and a first differential output terminal O1. The first differential input terminal IN1, IN2 comprises a first input terminal IN1 and a second input terminal IN2.

The differential output stage 300 further comprises a second differential output stage portion 302 having a second differential input terminal IN3, IN4 and a second differential output terminal O2. The second differential input terminal IN3, IN4 comprises a third input terminal IN3 and a fourth input terminal IN4.

As shown in the FIG. 3, the load RLOAD, LLOAD is electrically connected between said first differential output terminal O1 and the second differential output terminal O2.

As well as the differential output stage 200 of the first embodiment (FIG. 2), the differential output stage 300 is a output stage or buffer to be employed in a mono audio system.

In this regard, the same consideration previously made with reference to the amplification device 400 of FIG. 4 are also valid for an amplification device (not shown in the figures) comprising the PWM modulator 401, the first non-overlapping and voltage shifting block 402, the second non-overlapping and voltage shifting block 403 and the differential output stage 300 of the second embodiment, replacing the differential output stage 200 of the first embodiment.

As well as previously indicated for the first embodiment of FIG. 2, it should be observed that in the case of an application in a stereo audio system, also the differential output stage 300 of the second embodiment, to be considered for example the left side of a stereo audio system, is replicated to obtain also the right side of the stereo audio system.

In a corresponding way, with reference again to the amplification device 400 of FIG. 4, as well as previously indicated for the first embodiment of FIG. 2, also the PWM modulator 401, the first 402 and second 403 non-overlapping and voltage shifting block, to be considered for example the left side of a stereo audio system, are replicated in order to obtain the right side of the stereo audio system.

With reference again to FIG. 3, the first differential output stage portion 301 of the differential output stage 300 further comprising a first output circuit M1PSW, M1PCASC connected between the first reference potential VDD (previously defined) and the first differential output terminal O1.

The first differential output stage portion 301 further comprises a second output circuit M1NSW, M1NCASC connected between the second reference potential GND (previously defined) and the first differential output terminal O1.

The first differential output stage portion 301 further comprises a first driving circuit 310 of the first output circuit M1PSW, M1PCASC arranged to connect the first input terminal IN1 to a first driving terminal DT1 of the first output circuit M1PSW, M1PCASC. The first driving circuit 310 comprises a first biasing circuit M2P, M3N, M4N, R11, I11 arranged to provide to the first driving terminal DT1 a first driving signal DRIVEPSW.

The first differential output stage portion 301 further comprises a second driving circuit 320 of the second output circuit M1NSW, M1NCASC arranged to connect the second input terminal IN2 to a second driving terminal DT2 of the second output circuit M1NSW, M1NCASC. The second driving circuit 320 comprises a second biasing circuit I41, R41, M4P, M3P, M2N arranged to provide to the second driving terminal DT2 a second driving signal DRIVENSW.

The first differential output stage portion 301 advantageously further comprises a third output circuit M2PSW, M2PCASC connected between the first biasing circuit M2P, M3N, M4N, R11, I11 and the first differential output terminal O1. The third output circuit M2PSW, M2PCASC has a third driving terminal DT3 connected to the first driving terminal DT1.

In addition, the first differential output stage portion 301 advantageously further comprises a fourth output circuit M2NSW, M2NCASC connected between the second biasing circuit I41, R41, M4P, M3P, M2N and the first differential output terminal O1. The fourth output circuit M2NSW has a fourth driving terminal DT4 connected to the second driving terminal DT2.

From a circuital point of view, the description of the circuital structure of the first output circuit M1PSW, the second output circuit M1NSW, the first driving circuit 210, the first biasing circuit M2P, M3N, M4N, R11, I11, the second driving circuit 220, the second biasing circuit I41, R41, M4P, M3P, M2N, the third output circuit M2PSW and the fourth output circuit M2NSW of the differential output stage 200 of the first embodiment of FIG. 2 is also valid for the first output circuit M1PSW, M1PCASC, the second output circuit M1NSW, M1NCASC, the first driving circuit 310, the first biasing circuit M2P, M3N, M4N, R11, I11, the second driving circuit 320, the second biasing circuit I41, R41, M4P, M3P, M2N, the third output circuit M2PSW, M2PCASC and the fourth output circuit M2NSW, M2NCASC, respectively, of the differential output stage 300 of the third embodiment of FIG. 3, with the addition of the following technical features.

In a greater detail, the first output circuit M1PSW, M1PCASC comprises the fifth PMOS transistor M1PSW and a seventh PMOS transistor M1PCASC connected in a cascode configuration. The fifth PMOS transistor M1PSW is connected to the first differential output terminal O1 via the seventh PMOS transistor M1PCASC.

The third output circuit M2PSW, M2PCASC comprises the sixth PMOS transistor M2PSW and an eighth PMOS transistor M2PCASC connected in a cascode configuration. The sixth PMOS transistor M2PSW is connected to the first differential output terminal O1 via the eighth PMOS transistor M2PCASC.

In addition, the first driving circuit 310 further comprises a third resistor R21 having a first terminal connected to the first terminal of the first resistor R11 and a second terminal connected to the second reference potential GND via a third current generator I21. The seventh PMOS transistor M1PCASC and the eighth PMOS transistor M2PCASC each have a gate terminal connected to the second terminal of the third resistor R21.

According to an embodiment of the invention, the third resistor R21 is equal to the first resistor R11 and the third current generator I21 is equal to the first current generator I11.

The second output circuit M1NSW, M1NCASC comprises the fifth NMOS transistor M1NSW and a seventh NMOS transistor M1NCASC connected in a cascode configuration. The fifth NMOS transistor M1NSW is connected to the first differential output terminal O1 via the seventh NMOS transistor M1NCASC.

The fourth output circuit M2NSW, M2NCASC comprises the sixth NMOS transistor M2NSW and a eighth NMOS transistor M2NCASC connected in a cascode configuration. The sixth NMOS transistor M2NSW is connected to the first differential output terminal O1 via the eighth NMOS transistor M2NCASC.

Furthermore, the second driving circuit 320 comprises a fourth resistor R31 having a first terminal connected to the first terminal of the second resistor R41 and a second terminal connected to the first reference potential VDD via a fourth current generator I31. The seventh NMOS transistor M1NCASC and the eighth NMOS transistor M2NCASC have a gate terminal connected to the second terminal of the fourth resistor R31.

According to an embodiment of the invention, the fourth resistor R31 is equal to the second resistor R41 and the fourth current generator I31 is equal to the second current generator I41.

It should be observed that the second differential output stage portion 302 of the differential output stage 300 of the second embodiment of FIG. 3 is analogous to the first differential output stage portion 301, previously described.

With reference to FIG. 2, the operation of the differential output stage 200 of an amplification device 400, for a driving a load RLOAD, LLOAD, according to the first embodiment of the invention, is now described.

As previously indicated, the resistance R of a MOS transistor is 1/G, wherein G is the conductance of the MOS transistor, equal to the following equation:

$$G = dI/dVDS = k \cdot [(VGS-VT)-VDS] = k \cdot (VGS-VDS-VT)$$
$$= k \cdot [(VG-VS)-(VD-VS)-VT] = k \cdot (VGD-VT)$$

Therefore, in accordance to the present invention, in order to maintain the resistance R at a constant value, the gate-drain voltage VGD is controlled to be maintained to a constant value.

In particular, in a PMOS transistor, if the drain terminal is equal to the first reference potential VDD, the gate-drain voltage VGD is constant and no correction is needed. If the drain terminal is equal to the first differential output voltage VO1, the gate-drain voltage VGD, depending on the first differential output voltage VO1, is corrected by an amount corresponding to the difference between the first reference potential VDD and the first differential output voltage VO1, i.e. the gate terminal is modified by an amount corresponding to the drain-source voltage VDS of the PMOS transistor. The correction is performed on the first driving signal DRIVEPSW.

In a corresponding way, in a NMOS transistor, if the drain terminal is equal to the second reference potential GND, the gate-drain voltage VGD is constant and no correction is needed. If the drain terminal is equal to the first differential output voltage VO1, the gate-drain voltage VGD, depending on the first differential output voltage VO1, is corrected by an amount corresponding to the first differential output voltage VO1, i.e. the gate terminal is modified by an amount corresponding to the drain-source voltage VDS of the NMOS transistor. The correction is performed on the second driving signal DRIVENSW.

With reference again to FIG. 2, it should be noted that the operation of the first differential output stage portion 201 (positive) of the differential output stage 200 will be described. The same description could be repeated also for the second differential output stage portion 202.

In the case both the first differential digital input signal INPH provided to the first input terminal IN1 and the second differential digital input signal INPL provided to the second input terminal IN2 are at a low logical level (i.e. 0), the fifth PMOS transistor M1PSW (first output circuit) and the sixth PMOS transistor M2PSW (third output circuit) are OFF (because the second PMOS transistor M1P is ON) while the fifth NMOS transistor M1NSW (second output circuit) and the sixth NMOS transistor M2NSW (fourth output circuit) are ON (because the fourth NMOS transistor MIN is OFF). A first differential output voltage VO1 present on the first differential output terminal O1 is equal to:

$$VO1 = GND + IL*(Ron_{M1NSW})$$

wherein IL is the load current on the load RRLOAD, LLOAD; $Ron_{M1NSW}$ is the impedance of the fifth NMOS transistor M1NSW.

Therefore, the first differential output voltage VO1 present on the first differential output terminal O1 is close to the second reference potential GND, i.e. GND±300 mV. It should be noted that the voltage amount previously indicated (300 mV) depends on the signal in the audio base represented by the load current IL circulating on the load LLOAD, RRLOAD.

In addition, the third NMOS transistor M2N (second driving circuit 220) is OFF and the first PMOS transistor M2P (first driving circuit 210) is ON. Therefore, the second terminal of the third NMOS transistor M2N (hereinafter, also the first node N4 of the second biasing circuit I41, R41, M4P, M3P, M2N) is equal to the first differential output voltage VO1 that, as previously indicated, is close to the second reference potential GND, i.e. GND±300 mV. The second terminal of the first PMOS transistor M2P (hereinafter, also the first node N1 of the first biasing circuit M2P, M3N, M4N, R11, I11) is blocked and forced to the first reference potential VDD.

In the case both the first differential digital input signal INPH provided to the first input terminal IN1 and the second differential digital input signal INPL provided to the second input terminal IN2 are at a high logical level (i.e. 1), the fifth PMOS transistor M1PSW and the sixth PMOS transistor M2PSW are ON (because the second PMOS transistor M1P is OFF) while the fifth NMOS transistor M1NSW and the sixth NMOS transistor M2NSW are OFF (because the fourth NMOS transistor M1N is ON).

A first differential output voltage VO1 present on the first differential output terminal O1 is equal to:

$$VO1 = VDD + IL*(Ron_{M1PSW})$$

wherein IL is the load current on the load RRLOAD, LLOAD; $Ron_{M1PSW}$ is the impedance of the fifth PMOS transistor M1PSW.

Therefore, the first differential output voltage VO1 present on the first differential output terminal O1 is close to the first reference potential VDD, i.e. VDD±300 mV. As previously indicated, such voltage amount (300 mV) depends on the signal in the audio base represented by the load current IL circulating on the load LLOAD, RRLOAD.

In addition, the third NMOS transistor M2N is ON and the first PMOS transistor M2P is OFF. Therefore, the first node N4 of the second biasing circuit I41, R41, M4P, M3P, M2N is blocked and forced to the second reference potential GND through the negligible impedance of the third NMOS transistor M2N crossed by the current generated by the second current generator I41. The first node N1 of the first biasing circuit M2P, M3n, M4N, R11, I11 is equal to the first differential output voltage VO1 that, as previously indicated, is close to the first reference potential VDD, i.e. VDD±300 mV.

With reference to the load LLOAD, RLOAD to be driven as illustrated in FIG. 2, it should be also observed that a first load terminal OP and a second load terminal OM are of the differential type and therefore the load current IL is positive or negative according to the signal and the inductive filtering.

In view of this, the behavior of the first differential output stage portion 201 (positive) of the differential output stage 200 depends not only on the logical level (high or low) of both the first differential digital input signal INPH provided to the first input terminal IN1 and the second differential digital input signal INPL provided to the second input terminal IN2, but also on the fact that the load current IL was positive (entering in the first differential output terminal O1) or negative (load current IL outing from the first differential output terminal O1).

In view of this, the operation of the first differential output stage portion 201 of the differential output stage 200 is now described in the four possible cases indicated above.

It should be noted that the upper side of the first differential output stage portion 201 of the differential output stage 200 of FIG. 2 is arranged to control the switching versus the first reference potential VDD and the lower side of the first differential output stage portion 201 of the differential output stage 200 of FIG. 2 is arranged to control the switching versus the second reference potential GND.

In the first case, both the first differential digital input signal INPH provided to the first input terminal IN1 and the second differential digital input signal INPL provided to the second input terminal IN2 are at a high logical level (i.e. 1)

and the load current IL is positive (entering in the first differential output terminal O1).

Therefore, the first differential output voltage VO1 is higher than the first reference potential VDD, i.e. VDD+a value included in the range 0-300 mV, according to the value of the load current IL.

The first terminal of the fifth PMOS transistor M1PSW is connected to the first reference potential VDD. Therefore, the first terminal of the fifth PMOS transistor M1PSW is lower than the first differential output voltage VO1, i.e. the first terminal of the fifth PMOS transistor M1PSW can be considered the drain terminal of the fifth PMOS transistor M1PSW.

In view of this, in the first embodiment of FIG. 2, the first driving signal DRIVEPSW is not corrected because the first terminal of the fifth PMOS transistor M1PSW (drain terminal of the fifth PMOS transistor M1PSW) is at the first reference potential VDD and the corresponding gate-drain voltage VGD is constant because it is already referred to the first reference potential VDD (higher voltage value).

The sixth PMOS transistor M2PSW is ON and the first PMOS transistor M2P is OFF. Therefore, the first node N1 of the first biasing circuit M2P, M3N, M4N, R11, I11 is equal to the first differential output voltage VO1.

The second terminal of the first NMOS transistor M3N (hereinafter, also second node N2 of the first biasing circuit M2P, M3N, M4N, R11, I11) is equal to VO1−VT$_{M3N}$.

As shown in the FIG. 2, the second NMOS transistor M4N has the gate terminal connected to the first reference potential VDD. Therefore, the second NMOS transistor M4N is arranged to transfer to his second terminal (hereinafter, also third node N3 of the first biasing circuit M2P, M3N, M4N, R11, I11) voltages lower than VDD−VT$_{M4N}$, wherein VT$_{M4N}$ is the threshold voltage of the second NMOS transistor M4N. Considering, as previously indicated, that the threshold voltage of the first NMOS transistor M3N is equal to the threshold voltage of the second NMOS transistor M4N (VT$_{M3N}$=VT$_{M4N}$), as a consequence, the voltage on the third node N3 of the first biasing circuit M2P, M3N, M4N, R11, I11 is VDD−V$^{M3N}$.

Therefore, the first driving signal DRIVEPSW is equal to VDD−VT$_{M3N}$−VR11, wherein VR11 is the voltage drop on the first resistor R11, and is insensitive to the first differential output voltage VO1.

In the second case both the first differential digital input signal INPH provided to the first input terminal IN1 and the second differential digital input signal INPL provided to the second input terminal IN2 are at a high logical level (i.e. 1) and the load current IL is negative (outing in the first differential output terminal O1).

Therefore, the first differential output voltage VO1 is lower than the first reference potential VDD, i.e. VDD+a value included in the range −300-0 mV, according to the value of the load current IL.

The first terminal of the fifth PMOS transistor M1PSW is connected to the first reference potential VDD. Therefore, the first terminal of the fifth PMOS transistor M1PSW is higher than the first differential output voltage VO1, i.e. the second terminal of the fifth PMOS transistor M1PSW can be considered the drain terminal of the fifth PMOS transistor M1PSW.

In view of this, in the first embodiment of FIG. 2, the first driving signal DRIVEPSW is advantageously corrected because the second terminal of the fifth PMOS transistor M1PSW (drain terminal of the fifth PMOS transistor M1PSW) is at the first differential output voltage VO1 and the gate-drain voltage VGD (to be maintained constant) is referred to the first differential output voltage VO1. The first driving signal DRIVEPSW is referred to the first differential output voltage VO1, in order to maintain constant the gate-drain potential VGD.

The sixth PMOS transistor M2PSW is ON and the first PMOS transistor M2P is OFF. Therefore, the first node N1 of the first biasing circuit M2P, M3N, M4Nm R11, I11 is equal to the first differential output voltage VO1.

The second terminal of the first NMOS transistor M3N (hereinafter, also second node N2 of the first biasing circuit M2P, M3N, M4N, R11, I11) is equal to VO1−VT$_{M3N}$.

As shown in the FIG. 2, the second NMOS transistor M4N has the gate terminal connected to the first reference potential VDD. Therefore, the second NMOS transistor M4N is arranged to transfer to his second terminal (hereinafter, also third node N3 of the first biasing circuit M2P, M3N, M4N, R11, I11) voltages lower than VDD−VT$_{M4N}$, wherein VT$_{M4N}$ is the threshold voltage of the second NMOS transistor M4N. Considering, as previously indicated, that the threshold voltage of the first NMOS transistor M3N is equal to the threshold voltage of the second NMOS transistor M4N (VT$_{M3N}$=VT$_{M4N}$), as a consequence, the voltage on the third node N3 of the first biasing circuit M2P, M3N, M4N, R11, I11 is VO1−VT$_{M3N}$.

Therefore, the first driving signal DRIVEPSW is advantageously equal to VO1−VT$_{M3N}$−VR11 wherein VT$_{M3N}$ is the threshold voltage of the first NMOS transistor M3N and the voltage VR11 is the voltage drop on the first resistor R11.

In the third case, both the first differential digital input signal INPH provided to the first input terminal IN1 and the second differential digital input signal INPL provided to the second input terminal IN2 are at a low logical level (i.e. 0) and the load current IL is positive (entering in the first differential output terminal O1).

In view of this, the first differential output voltage VO1 is higher than the second reference potential GND, i.e. GND+a value included in the range 0-300 mV, according to the value of the load current IL.

The first terminal of the fifth NMOS transistor M1NSW is connected to the second reference potential GND. Therefore, the first terminal of the fifth NMOS transistor M1NSW is lower than the first differential output voltage VO1, i.e. the second terminal of the fifth NMOS transistor M1NSW can be considered the drain terminal of the first NMOS transistor M1NSW.

In view of this, in the first embodiment of FIG. 2, the second driving signal DRIVENSW is advantageously corrected because the second terminal of the fifth NMOS transistor M1NSW (drain terminal of the fifth NMOS transistor M1NSW) is at the first differential output voltage VO1 and the gate-drain voltage VGD (to be maintain constant) is referred to the first differential output voltage VO1. The second driving signal DRIVENSW is referred to the first differential output voltage VO1, maintaining constant the gate-drain voltage VGD.

The sixth NMOS transistor M2NSW is ON and the third NMOS transistor M2N is OFF. Therefore, the first node N4 of the second biasing circuit I41, R41, M4P, M3P, M2N is equal to the first differential output voltage VO1.

The second terminal of the fourth PMOS transistor M3P (hereinafter, also second node N5 of the second biasing circuit I41, R41, M4P, M3P, M2N) is equal to VO1+VT$_{M3P}$.

As shown in the FIG. 2, the third PMOS transistor M4P has the gate terminal connected to the second reference potential GND. Therefore, the third PMOS transistor M4P is arranged to transfer to his second terminal (hereinafter, also third node N6 of the second biasing circuit I41, R41, M4P, M3P, M2N) voltages greater than $VT_{M4P}$, threshold voltage of the third PMOS transistor M4P. Considering, as previously indicated, that the threshold voltage of the fourth PMOS transistor M3P is equal to the threshold voltage of the third PMOS transistor M4P ($VT_{M3P}=VT_{M4P}$), as a consequence, the voltage on the third node N6 of the second biasing circuit I41, R41, M4P, M3P, M2N is $VT_{M4P}+VO1$.

Therefore, the second driving signal DRIVENSW is advantageously equal to $VO1+VT_{M4P}+V_{R41}$, wherein $V_{R41}$ is the voltage drop on the second resistor R41.

In the fourth case, both the first differential digital input signal INPH provided to the first input terminal IN1 and the second differential digital input signal INPL provided to the second input terminal IN2 are at a low logical level (i.e. 0) and the load current IL is negative (outing in the first differential output terminal O1).

In view of this, the first differential output voltage VO1 is lower than the second reference potential GND, i.e. GND+a value included in the range −300-0 mV, according to the value of the load current IL.

The first terminal of the fifth NMOS transistor M1NSW is connected to the second reference potential GND. Therefore, the first terminal of the fifth NMOS transistor M1NSW is higher than the first differential output voltage VO1, i.e. the first terminal of the fifth NMOS transistor M1NSW can be considered the drain terminal of the fifth NMOS transistor M1NSW.

In view of this, the second driving signal DRIVENSW is not corrected because the first terminal of the fifth NMOS transistor M1NSW (drain terminal of the fifth NMOS transistor M1NSW) is at the second reference potential GND and the corresponding gate-drain voltage VGD is constant because it is already referred to the second reference potential GND (higher voltage value).

The sixth NMOS transistor M2NSW is ON and the third NMOS transistor M2N is OFF. Therefore, the first node N4 of the second biasing circuit I41, R41, M4P, M3P, M2N is equal to the first differential output voltage VO1.

The second terminal of the PMOS transistor M3P (hereinafter, also second node N5 of the second biasing circuit I41, R41, M4P, M3P, M2N) is equal to $VO1+VT_{M3P}$.

Considering that the voltage at the second node N5 of the second biasing circuit I41, R41, M4P, M3P, M2N is lower than $VT_{M3P}$, because it is equal to $VT_{M3P}+VO1$, the third PMOS transistor M4P is arranged to lead the third node N6 of the second biasing circuit I41, R41, M4P, M3P, M2N to voltages greater than $VT_{M4P}$ because its gate terminal is connected to the second reference potential GND. Therefore, if the first differential output voltage VO1 is negative, the third node N6 of the second biasing circuit I41, R41, M4P, M3P, M2N is fixed to $VT_{M4P}$ and the negative differential output voltage VO1 is not added.

As a result, the second driving signal DRIVENSW is equal to $GND+VT_{M4P}+VR41$ and is insensitive to the variation of the first differential output voltage VO1.

With reference now to the second embodiment of FIG. 3, it should be observed that the operation of the differential output stage 200 previously described is also valid for the differential output stage 300.

In addition, the operation of how the differential output stage 300 also drives the MOS transistors in cascode configuration is briefly described.

In fact, in the corresponding way, the differential output stage 300 is arranged to correct the voltage VPCASC on the gate terminal of both the seventh PMOS transistor M1PCASC and the eighth PMOS transistor M2PCASC as well as previously described for driving the fifth PMOS transistor M1PSW and the sixth PMOS transistor M2PSW, respectively.

In the same way, the differential output stage 300 is also arranged to correct the voltage VNCASC on the gate terminal of both the seventh NMOS transistor M1NCASC and the eighth NMOS transistor M2NCASC as well as previously described for driving the fifth NMOS transistor M1NSW and the sixth NMOS transistor M2NSW, respectively.

Therefore, in the first case (both the first differential digital input signal INPH provided to the first input terminal IN1 and the second differential digital input signal INPL provided to the second input terminal IN2 are at a high logical level (i.e. 1) and the load current IL is positive), the gate terminal of the seventh PMOS transistor M1PCASC (and the gate terminal of the eighth PMOS transistor M2PCASC) is at a voltage equal to $VPCASC=VDD-VT_{M3N}-V_{R21}$ and is insensitive to the first differential output voltage V01. The voltage $V_{R21}$ is the voltage drop on the third resistor R21.

In the second case (both the first differential digital input signal INPH provided to the first input terminal IN1 and the second differential digital input signal INPL provided to the second input terminal IN2 are at a high logical level (i.e. 1) and the load current IL is negative), the gate terminal of the seventh PMOS transistor M1PCASC (and the gate terminal of the eighth PMOS transistor M2PCASC) is advantageously at a voltage equal to $VPCASC=VO1-VT_{M3N}-V_{R21}$.

In the third case (both the first differential digital input signal INPH provided to the first input terminal IN1 and the second differential digital input signal INPL provided to the second input terminal IN2 are at a low logical level (i.e. 0) and the load current IL is positive), the gate terminal of the seventh NMOS transistor M1NCASC (and the gate terminal of the eighth NMOS transistor M2NCASC) is advantageously to a voltage equal to $VNCASC=VO1+VT_{M4P}+V_{R31}$ wherein the voltage $V_{R31}$ is the voltage drop at the fourth resistor R31.

In the fourth case (both the first differential digital input signal INPH provided to the first input terminal IN1 and the second differential digital input signal INPL provided to the second input terminal IN2 are at a low logical level (i.e. 0) and the load current IL is negative), the gate terminal of the seventh NMOS transistor M1NCASC (and the gate terminal of the eighth NMOS transistor M2NCASC) is to a voltage equal to $VNCASC=GND+VT_{M4P}+V_{R31}$ and is insensitive to the first differential output voltage VO1.

According to the embodiments of FIGS. 2 and 3, the fourth PMOS transistor M3P and the third PMOS transistor M4P have the body terminal connected to the second terminal (source) in order to better equalize the thresholds voltage values (the same is valid for the second NMOS transistor M3N and the third NMOS transistor M4N).

According to another embodiment, if the difference is acceptable, according to specification limits, it is possible to connect the body terminals of the fourth PMOS transistor M3P and the third PMOS transistor M4P to the first reference potential VDD (the supply voltage). In a corresponding way, the body terminals of the first NMOS transistor M3N and the second NMOS transistor M4N can be connected to the second reference potential GND.

In addition, in the case of applications different from the described, if the load current IL flowing in the NMOS transistors requiring the linearization (the fifth NMOS transistor M1NSW and the seventh NMOS transistor M1NCASC, the last one if present) is always positive, according to another embodiment, the fourth PMOS transistor M3P and the third PMOS transistor M4P can be eliminated shorting the third node N6 of the second biasing circuit I41, R41, M4P, M3P, M2N to the first node N4 of the second biasing circuit I41, R41, M4P, M3P, M2N. The same criteria applies for the linearization of PMOS transistors (the fifth PMOS transistor M1PSW and the seventh PMOS transistor M1PCASC, the last one if present) in the case of a load current IL that is always negative, i.e. the first NMOS transistor M3N and the second NMOS transistor M4N can be eliminated shorting the first node N1 of the first biasing circuit M2P, M3N, M4N, R11, I11 to the third node N3 of the first biasing circuit M2P, M3N, M4N, R11, I11.

It should be further observed that the equality of the voltage on the gate terminal of the seventh NMOS transistor M1NCASC and the second driving signal DRIVENSW (VPCASC=DRIVEPSW) is a guideline. According to different embodiments of the present invention, they can be different according to specific limits and design conveniences.

Furthermore, according to other embodiments of the present invention, it should be considered that it is possible to add one or more diodes in series between the third PMOS transistor M4P and the second resistor R41 (and in a corresponding way, between the second NMOS transistor M4N and the first resistor R11), obtaining the same result of the described embodiments.

The present invention allows to add to the gate voltage of NMOS/PMOS output transistors (M1NSW, M1PSW) the $VDS_{M1NEQ}/VDS_{M1PEQ}$ only if the first differential output voltage VO1 is at a low level and the load current IL is positive and if the first differential output voltage is at a high level and the load current IL is negative, respectively, therefore correcting and linearizing the impedance of the NMOS/PMOS output transistors only when the linearization is really useful.

In other words, the present invention allows to drive the "on" state of the output switches of a differential output stage with a gate voltage referred to the differential output voltage (VO1, VO2) and not only to the relative power supply (first reference potential VDD for the PMOS transistors and the second reference potential GND for the NMOS transistors) and further it allows to select, according to load current direction, reference potential (first reference potential VDD for the PMOS transistors and the second reference potential GND for the NMOS transistors) or differential output voltage (VO1, VO2) as reference while in the "off" state of the output switches the driving signal is the reference potential (the first reference potential VDD for the PMOS transistors and the second reference potential GND for the NMOS transistors).

Furthermore, the present invention allows to largely increase the linearity of the signal on the load RLOAD, LLOAD, saving switches area and current (mainly for open-loop class-D buffers), through a switch driving that maintains the voltage VGD constant, also for bidirectional load current.

From a circuital point of view, low cost MOS transistor has been added with respect to the known prior art (FIG. 1), without increasing the output MOS transistor dimensions, that act on the output MOS gate voltage, with the scope to compensate the residual resistance variation, also taking into account the fact that the variation is not symmetrical for load current IL positive or load current IL negative. The result is a large increase of the output signal linearity, mainly at high signal level, measurable as S/(N+THD). The MOS transistor reliability is also respected.

Figure 1:
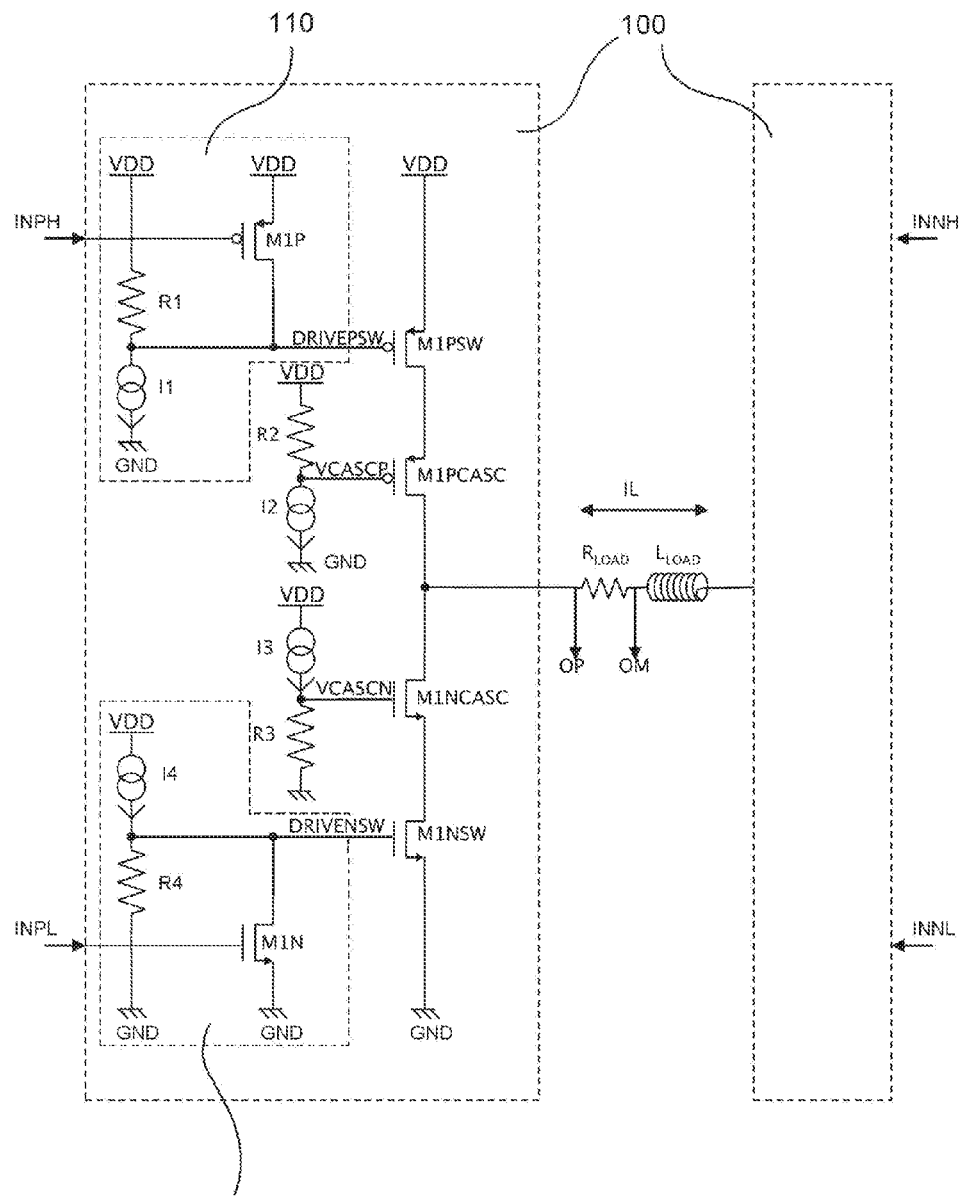
FIG. 1 shows a circuit diagram of a differential output stage of the prior art.

Comparing the present invention with the prior art, in the worst case, in front of ±150 mV max output drop, simulations showed that the circuit of FIG. 1 (prior art) presents a 7.4% of resistor variation, while the circuits of the present invention (FIG. 2 or FIG. 3) results on a 1.7%. The S/(N+THD) of the output signal passes from 64 dB to 75 dB. In the typical case the difference is greater.

It is also possible to obtain the same distortion performances of the previous solution reducing the output stage dimension.

In other words, with a very small area increasing, a big linearity increment is obtained.

The invention claimed is:

1. A differential output stage of an amplification device, for driving a load, comprising:
   a first differential output stage portion having a first differential input terminal and a first differential output terminal, said first differential input terminal comprising a first input terminal and a second input terminal;
   a second differential output stage portion having a second differential input terminal and a second differential output terminal, said second differential input terminal comprising a third input terminal and a fourth input terminal, the load being electrically connected between said first and second differential output terminal;
   the first differential output stage portion further comprising:
   a first output circuit connected between a first reference potential and said first differential output terminal;
   a second output circuit between a second reference potential and said first differential output terminal;
   a first driving circuit of the first output circuit arranged to connect said first input terminal to a first driving terminal of said first output circuit, said first driving circuit comprising a first biasing circuit arranged to provide to the first driving terminal a first driving signal;
   a second driving circuit of the second output circuit arranged to connect said second input terminal to a second driving terminal of said second output circuit, said second driving circuit comprising a second biasing circuit arranged to provide to the second driving terminal a second driving signal; and
   wherein the first differential output stage portion further comprises:
   a third output circuit connected between a first node of said first biasing circuit and the first differential output terminal, said third output circuit having a third driving terminal connected to said first driving terminal,
   a fourth output circuit connected between a first node of said second biasing circuit and the first differential output terminal, said fourth output circuit having a fourth driving terminal connected to said second driving terminal.

2. The differential output stage of claim 1, wherein the first biasing circuit comprises a first PMOS transistor, a first NMOS transistor, a second NMOS transistor, a first resistor and a first current generator connected in series between the first reference potential and the second reference potential.

3. The differential output stage of claim 2, wherein:
   the first PMOS transistor has a first terminal connected to the first reference potential, a second terminal connected to a first terminal of the first NMOS transistor, a gate terminal connected to the first input terminal;
   the first NMOS transistor has a second terminal connected to a first terminal of the second NMOS transistor and to a body terminal of the first NMOS transistor, a gate terminal connected to the first terminal of the first NMOS transistor; and the second NMOS transistor having a second terminal and a body terminal connected to each other and to a first terminal of the first resistor and a gate terminal connected to the first reference potential.

4. The differential output stage of claim 3, wherein the first resistor has a second terminal connected to the second reference potential via the first current generator, the second terminal of the first resistor being connected to the first driving terminal.

5. The differential output stage of claim 2, wherein the first driving circuit further comprises a second PMOS transistor having a first terminal connected to the first reference potential and a second terminal connected to the first driving terminal, the second PMOS transistor having a gate terminal connected to the first input terminal.

6. The differential output stage of claim 5, wherein the second biasing circuit comprises a second current generator, a second resistor, a third PMOS transistor, a fourth PMOS transistor and a third NMOS transistor connected in series between the first reference potential and the second reference potential.

7. The differential output stage of claim 6, wherein:
the third NMOS transistor has a first terminal connected to the second reference potential, a second terminal connected to a first terminal of the fourth PMOS transistor, a gate terminal connected to the second input terminal;

the fourth PMOS transistor has a second terminal connected to a first terminal of the third PMOS transistor and to a body terminal of the fourth PMOS transistor, a gate terminal connected to the first terminal of the fourth PMOS transistor; and the third PMOS transistor comprises a second terminal and a body terminal connected to each other and to a first terminal of the second resistor and a gate terminal connected to the second reference potential.

8. The differential output stage of claim 7, wherein the second resistor has a second terminal connected to the first reference potential via the second current generator, the second terminal of the second resistor being connected to the second driving terminal.

9. The differential output stage of claim 6, wherein the second driving circuit further comprises a fourth NMOS transistor having a first terminal connected to the second reference potential and a second terminal connected to the second driving terminal, the fourth NMOS transistor having a gate terminal connected to the second input terminal.

10. The differential output stage of claim 6, wherein the first output circuit comprises a fifth PMOS transistor having a first terminal connected to the first reference potential, a second terminal connected to the first differential output terminal and a gate terminal connected to the first driving terminal.

11. The differential output stage of claim 10, wherein the third output circuit comprises a sixth PMOS transistor having a first terminal connected to the first node of the first biasing circuit, a second terminal connected to the first differential output terminal, and a gate terminal connected to the third driving terminal.

12. The differential output stage of claim 9, wherein the second output circuit comprises a fifth NMOS transistor having a first terminal connected to the second reference potential, a second terminal connected to the first differential output terminal and a gate terminal connected to the second driving terminal.

13. The differential output stage of claim 12, wherein the fourth output circuit comprises a sixth NMOS transistor having a first terminal connected to the first node of the second biasing circuit, a second terminal connected to the first differential output terminal, and a gate terminal connected to the fourth driving terminal.

14. The differential output stage of claim 11, wherein the first output circuit comprises the fifth PMOS transistor and a seventh PMOS transistor connected in a cascode configuration, the fifth PMOS transistor being connected to the first differential output terminal via the seventh PMOS transistor.

15. The differential output stage of claim 14, wherein the third output circuit comprises the sixth PMOS transistor and an eighth PMOS transistor connected in a cascode configuration, the sixth PMOS transistor being connected to the first differential output terminal via the eighth PMOS transistor.

16. The differential output stage of claim 15, wherein the first driving circuit comprises a third resistor having a first terminal connected to the first terminal of the first resistor and a second terminal connected to the second reference potential via a third current generator, the seventh PMOS transistor and the eighth PMOS transistor each having a gate terminal connected to the second terminal of the third resistor.

17. The differential output stage of claim 13, wherein the second output circuit comprises the fifth NMOS transistor and a seventh NMOS transistor connected in a cascode configuration, the fifth NMOS transistor being connected to the first differential output terminal via the seventh NMOS transistor.

18. The differential output stage of claim 17, wherein the fourth output circuit comprises the sixth NMOS transistor and an eighth NMOS transistor connected in a cascode configuration, the sixth NMOS transistor being connected to the first differential output terminal via the eighth NMOS transistor.

19. The differential output stage of claim 18, wherein the second driving circuit comprises a fourth resistor having a first terminal connected to the first terminal of the second resistor and a second terminal connected to the first reference potential via a fourth current generator, the seventh NMOS transistor and the eighth NMOS transistor each having a gate terminal connected to the second terminal of the fourth resistor.

* * * * *